United States Patent [19]

Kolm et al.

[11] 4,048,596
[45] Sept. 13, 1977

[54] LIGHT-ACTIVATED REMOTE CONTROL UNIT

[75] Inventors: Eric A. Kolm, Brookline, Mass.; Robert R. Trottier, Woonsocket, R.I.

[73] Assignee: Signal Science Systems, Inc., Framingham, Mass.

[21] Appl. No.: 568,938

[22] Filed: Apr. 17, 1975

[51] Int. Cl.² ............. H01J 39/12; H01H 47/24; H01H 47/32
[52] U.S. Cl. ............. 334/8; 250/206; 250/209; 250/210
[58] Field of Search .................. 334/8–10; 307/311; 317/124, 125, 126, 127, 128, 129, 130; 250/221, 222 R, 220 R, 225, 226, 200, 206, 208, 210, 213 A, 213 VT; 361/173–176

[56] References Cited

U.S. PATENT DOCUMENTS

| | | |
|---|---|---|
| 2,964,685 | 12/1960 | Raymond .................. 317/127 X |
| 3,089,065 | 5/1963 | Worden ..................... 317/124 X |
| 3,131,332 | 4/1964 | Guri ........................... 317/124 X |
| 3,248,549 | 4/1966 | Sanabria .................... 250/210 |
| 3,325,593 | 6/1967 | Platt et al. ................ 334/8 X |
| 3,529,214 | 9/1970 | Corn .......................... 317/124 |
| 3,573,684 | 4/1971 | Dickinson ................. 334/8 X |
| 3,621,356 | 11/1971 | Chi On ..................... 250/210 X |
| 3,883,736 | 5/1975 | Liddell ..................... 250/221 |

Primary Examiner—Alfred E. Smith
Assistant Examiner—Marvin Nussbaum
Attorney, Agent, or Firm—Cesari and McKenna

[57] ABSTRACT

A remote control unit for an electrical appliance includes a pair of photocells and one or more threshold devices connected to sense differential illumination of the photocells. The threshold devices, in turn, emit signals that initiate operation of a control device connected to the appliance. The threshold devices are preferably gaseous discharge lamps whose light outputs are sensed by radiation-response switching circuitry.

16 Claims, 4 Drawing Figures

LIGHT-ACTIVATED REMOTE CONTROL UNIT

BACKGROUND OF THE INVENTION

A. Field of the Invention

This invention relates to a light-sensitive remote control unit for electrical appliances. More specifically it relates to a simple, inexpensive control unit actuated by the beam from a common flashlight and capable of multiple control functions of an appliance. The embodiment of the invention described herein is arranged for the control of a television set.

B. Background of the Invention

The wireless remote control of home appliances is presently applied almost exclusively to television receivers. This is probably due to two factors, namely, (a) the need to exercise frequent control of a television receiver, usually in changing channels and (b) the fact that the user is sitting or reclining at some distance from the receiver and finds it a nuisance to go to the receiver every time a control function is to be exercised.

Prior to the present invention, the commercially successful remote controls for television receivers have used sonic, or more specifically, ultrasonic transmissions as the control vehicle. In one of these systems, the user has an ultrasonic transmitting unit that is provided with a number of buttons. Actuation of a button causes a transmission at a unique frequency and an ultrasonic receiver built into the television receiver responds to that frequency by emitting an electrical control signal that brings about a corresponding control function such as channel change, etc. This system is relatively expensive and furthermore, by virtue of the manner in which it effects control within the television receiver, is not readily adaptable to receivers that were not originally constructed to accommodate it.

A less expensive wireless remote control unit that is easily fitted to existing television receivers is described in the co-pending application of Eric A. Kolm, Ser. No. 476,438 for Remote Television Control filed June 5, 1974, the disclosure of which is incorporated herein by reference. In that system the user has a simple ultrasonic transmitter that transmits on a single frequency. By simply controlling the timing of transmissions from his control unit he can cause an ultrasonic receiver at the television set to effect different control functions such as channel change and on-off switching. The present invention is directed to a control unit that is even lower in cost than this.

Another suggested arrangement uses light as the transmission vehicle. The user aims a flashlight beam at one of several photocells positioned at the television receiver, the electrical outputs of the photocells effecting the desired control functions. All such systems known to me are impractical because they can respond also to changes in the ambient light level, resulting in false triggering of the various control functions. Moreover, for multiple control functions they are characterized by either complicated and therefore relatively expensive circuitry or, on the other hand, by impractical operating procedures.

SUMMARY OF THE INVENTION

My invention also makes use of a light beam as the transmission vehicle for the control signals. However, in contrast with the prior systems discussed above, I employ a pair of photocells connected in a circuit that responds to the difference in illumination of the two cells. Since both cells respond essentially equally to the ambient light level, changes in that level do not cause false control signals. On the other hand, when the user trains a flashlight beam on one of the cells, the circuitry responds to the difference in the illumination of the two cells to effect the desired control function.

Two-photocell arrangements have been used before to reduce the effect of ambient light, for example in the control of toys as described in U.S. Pat. No. 3,621,356. They have not, so far as I know, been used in low-cost control of appliances, where reliability of operation is much more important than in toys. The reliability is enhanced in the control units described herein by the use of filters that largely limit the response of the photocells to the infrared region of the spectrum. This excludes most ambient household light but does not greatly decrease the sensitivity to a flashlight beam, which has a fairly large infrared content. The filters thus reduce the change in circuit sensitivity which would otherwise result from very high ambient light levels and they also materially reduce the liklihood of false operation in response to large changes in ambient levels if the responses of photocells are not closely matched.

The controller, as will be seen, is low in cost and yet it is easily operated to provide multiple control functions.

DETAILED DESCRIPTION OF THE INVENTION

Figure 1:
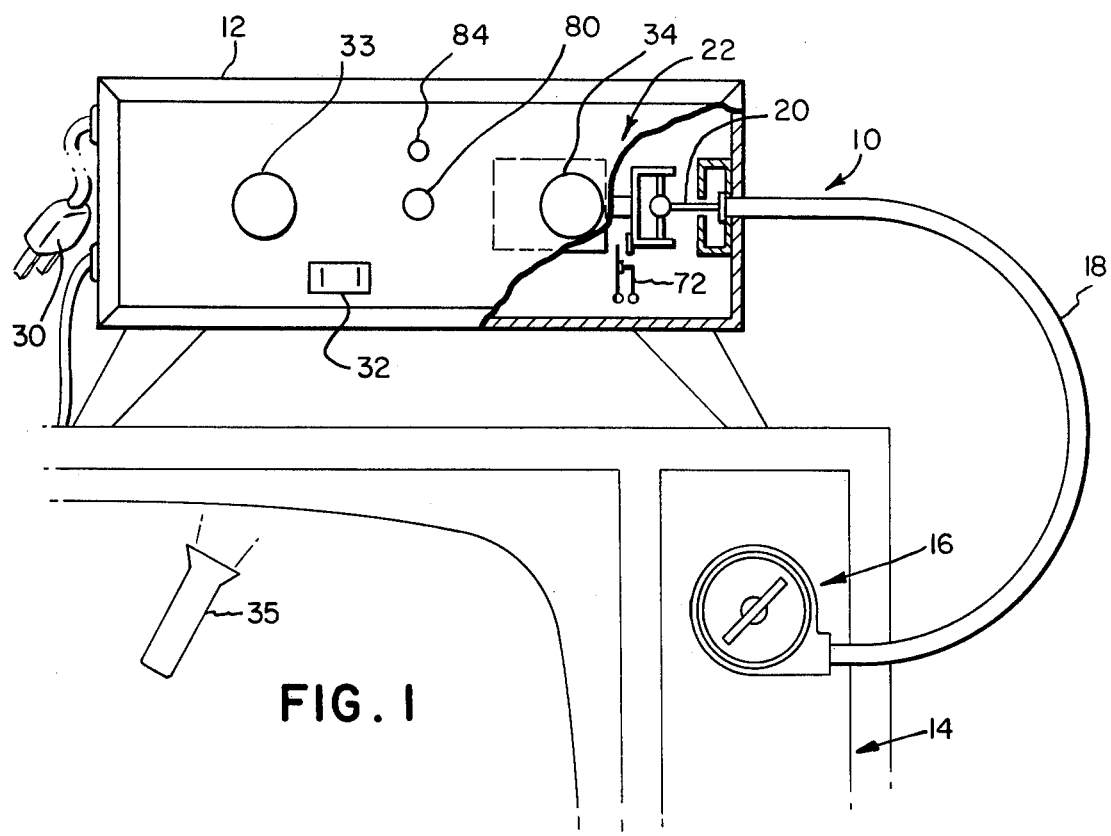
FIG. 1 is a front view, partly broken away, of an appliance control unit embodying the invention, connected to control the operation of a television receiver.

As shown in FIG. 1, a control unit generally depicted at 10 comprises a housing 12 located on top of a conventional television receiver 14. The housing 12 is connected to a channel changing adapter 16 by way of a cable 18. The adapter 16 is fitted to the shaft (not shown) of the tuner in the receiver 14 and when actuated by means of a flexible shaft 20 within the cable 18, it advances the tuner from one television channel to the next.

More specifically, the shaft 20 is actuated by a solenoid actuator 22 which is energized to pull the shaft 20 to the left each time the television channel is to be changed. The actuator 22, adapter 16 and associated parts are preferably as described in the aforesaid U.S. Pat. application, Ser. No. 476,438.

The control unit 10 also includes a plug 30 for connection to a household electrical receptacle and a receptacle 32 into which the receiver 14 is plugged.

In the housing 12 there are a pair of photocell units comprising windows 33 and 34 and a pair of photocells, described below, disposed behind the windows. To control various functions of the receiver 14, the user directs the beam from an ordinary battery-powered flashlight 35 on one or the other of these photocell units, depending on the particular embodiment of the invention. The housing 12 also contains electronic circuitry for effecting operation of the channel changing mechanism and turning the receiver 14 on and off in response to photocell illumination, as will now be described with reference to FIG. 2.

Figure 2:
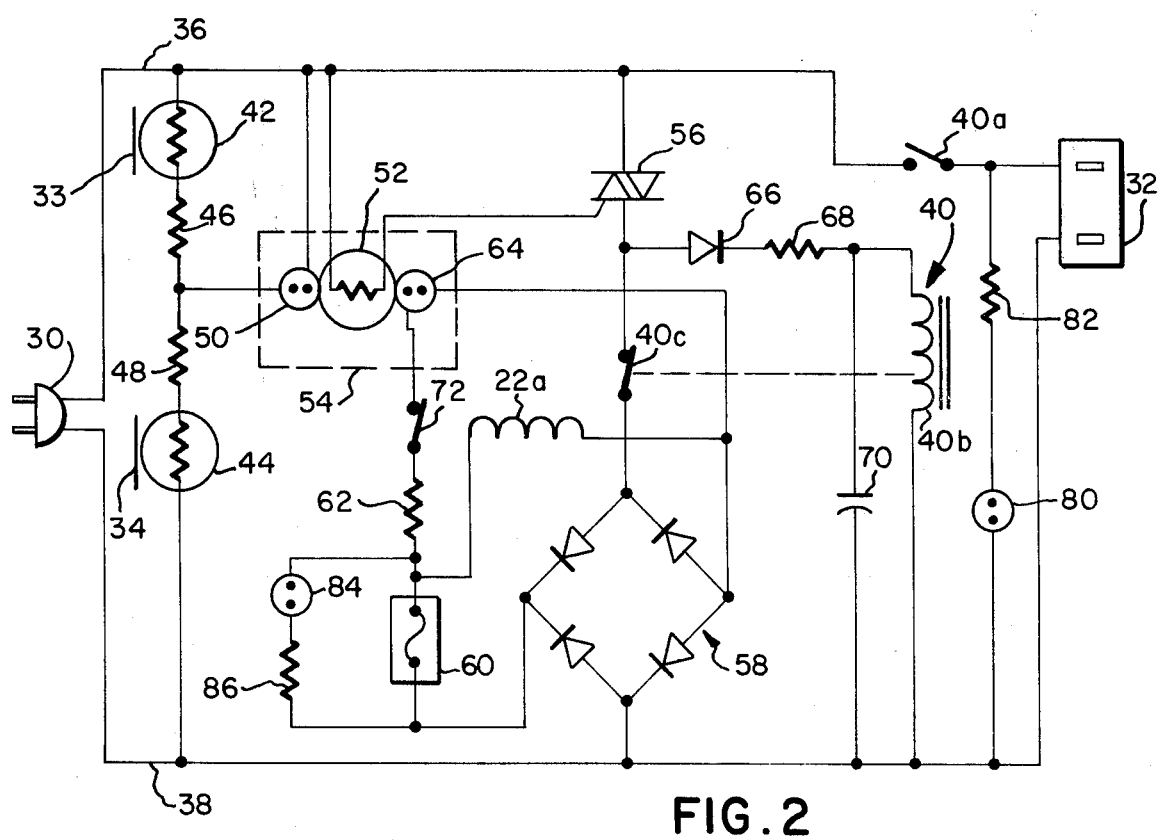
FIG. 2 is a schematic diagram of the electrical circuit in the control unit of FIG. 1.

As shown in FIG. 2, the plug 30 is connected to a pair of conductors 36 and 38. The conductor 38 in turn, connects directly to one of the contacts in the receptacle 32. The conductor 36 is connected to the other contact in the receptacle 32 by way of a pair of switch contacts 40a in a relay generally indicated at 40.

A pair of photocells 42 and 44, positioned behind the windows 33 and 34, are connected in series with current limiting resistors 46 and 48 between the conductors 36 and 38. The photocells 42 and 44 are of the photoconductive type and preferably they are quite sensitive in the infrared region of the spectrum. Cadmium sulfide photocells, for example, have these characteristics.

A neon lamp 50, connected in parallel with the photocell 42 and its series resistor 46, is disposed adjacent to a photocell 52 in a small light-tight housing 54. The photocell 52 is connected between the conductor 36 and the gate electrode of a triac 56. The anode-cathode conductive path of the triac 56, in turn, is connected in series with a bridge rectifier 58 between the conductors 36 and 38. The output of the rectifier 58 is applied to the coil 22a of the actuator 22 (FIG. 1), a thermal cutout switch 60 being connected in series with the coil 22a. The output of the rectifier 58 is also applied, by way of the switch 60 and a current limiting resistor 62, to a second neon lamp 64 within the housing 54 and adjacent to the photocell 52.

The cathode of the triac 56 is also connected to a rectifying diode 66 whose output is applied to the coil 40b of the relay 40 by way of a time delay circuit comprising a series resistor 68 and a parallel capacitor 70.

The photocells 42 and 44 and their associated resistors 46 and 48 form a voltage divider, with the neon lamp 50 connected to respond to the output of the divider. Thus, when the ambient light level changes, the resistances of the photocells 42 and 44 will change by approximately the same amount and the voltage applied to the lamp 50 will not change by an amount sufficient to light the lamp. On the other hand, when a beam from the flashlight 35 (FIG. 1) is aimed at the window 34, the resulting drop in resistance of the photocell 44 and the concommitant increase in the voltage across the lamp 50 will ignite the lamp. The light from the lamp 50 then causes a decrease in the resistance of the photocell 52 and the resulting increase in the gate current in the triac 56 turns on the triac to apply the line voltage to the bridge rectifier 58.

The output of the rectifier 58 thus energizes the solenoid actuator coil 22a so that the actuator 22 (FIG. 1) begins to pull the flexible shaft 20 to the left and thereby commences the channel-changing operation in the adapter 16.

At the same time, the output of the rectifier 58 lights the lamp 64. This output of the lamp then maintains the photocell 52 in its low resistance condition, even though the flashlight beam is removed from the photocell 44, so as to continue conduction in the triac 56. The triac continues to conduct until the actuator 22 (FIG. 1) approaches its leftmost position, at which point a bracket connected between the actuator and the cable 20 engages a limit switch 72 and thereby opens the switch.

As seen in FIG. 2, this interrupts the current to the lamp 64, thereby turning off the lamp and derivatively turning off the triac 56 so as to terminate the current to the actuator coil 22a. The actuator 22 (FIG. 1) thereupon returns to the right to its rest position. This arrangement ensures that when the beam from the flashlight 35 is aimed at the window 34, however momentarily, the actuator 22 will travel the full distance required for a channel change and then turns off the energizing current.

The circuit thus automatically compensates for different characteristics in individual channel-changing mechanisms and in changes in these characteristics over an extended period of time, both of which result in variations in the time required for a complete solenoid actuation. Also, it permits a very short duration of flashlight illumination, so that the user can easily change channels without triggering the on-off function about to be described.

To exercise control over the on-off function, the user holds the flashlight beam on the window 34 for a more extended period of time, e.g. 1.5 seconds, so as to exceed the delay provided by the resistor 68 and capacitor 70. The triac 56 conducts as before and after the delay, the current through the relay coil 40b closes or opens the contacts 40a to fully connect the receptacle 32 to the power line or disconnect it therefrom. Specifically, the relay 40 has a conventional ratchet-type impulse mechanism connected to its armature so that each time its coil 40b is energized, this mechanism changes the state of contacts 40a, i.e., opens or closes them.

The relay 40 also has a pair of normally closed contacts 40c in series with the rectifier 58. The contacts 40c open whenever the relay 40 is energized, thereby interrupting the current to the actuator solenoid coil 22a. This permits the use of a relatively low cost coil 22a, i.e., one not designed for operation, without the danger of burnout if the flashlight beam is held on the photocell 44 for a long time.

Since the windows 33 and 34 are filters that preferentially pass energy in the infrared region, they shield the photocells 42 and 44 from most of the energy in the band of ambient household radiant energy. This largely prevents the loss in sensitivity in the detection circuitry which would otherwise result from high levels of ambient radiation. Moreover, high radiation levels might cause sufficient unbalance to spuriously effect the control functions unless the characteristics of the two photocells are closely matched.

The immunity to spurious operation resulting from changes in the ambient radiation level is enhanced by the use of the neon lamp 50, which turns on only after its voltage reaches substantial threshold level. This threshold function might also be provided by an incandescent lamp or a light-emitting diode in series with a trigger device such as a four-layer diode. The neon lamp is preferred because it provides the desired threshold characteristic in conjunction with high reliability, large light output and low cost.

A neon front panel lamp 80 (FIG. 1) is connected in series with a current limiting resistor 82 (FIG. 2) between the contacts in the receptacle 32. The lamp 80 is thus lit whenever power is supplied by the control unit 10 to the television receiver 14. Another neon lamp 84 and series resistor 86 are connected across the thermal cutout switch 60. Thus, if the switch 60 should open, the lamp 84 will light, thus providing a front panel indication (FIG. 1) that the switch 60 must be reset.

Figure 3:
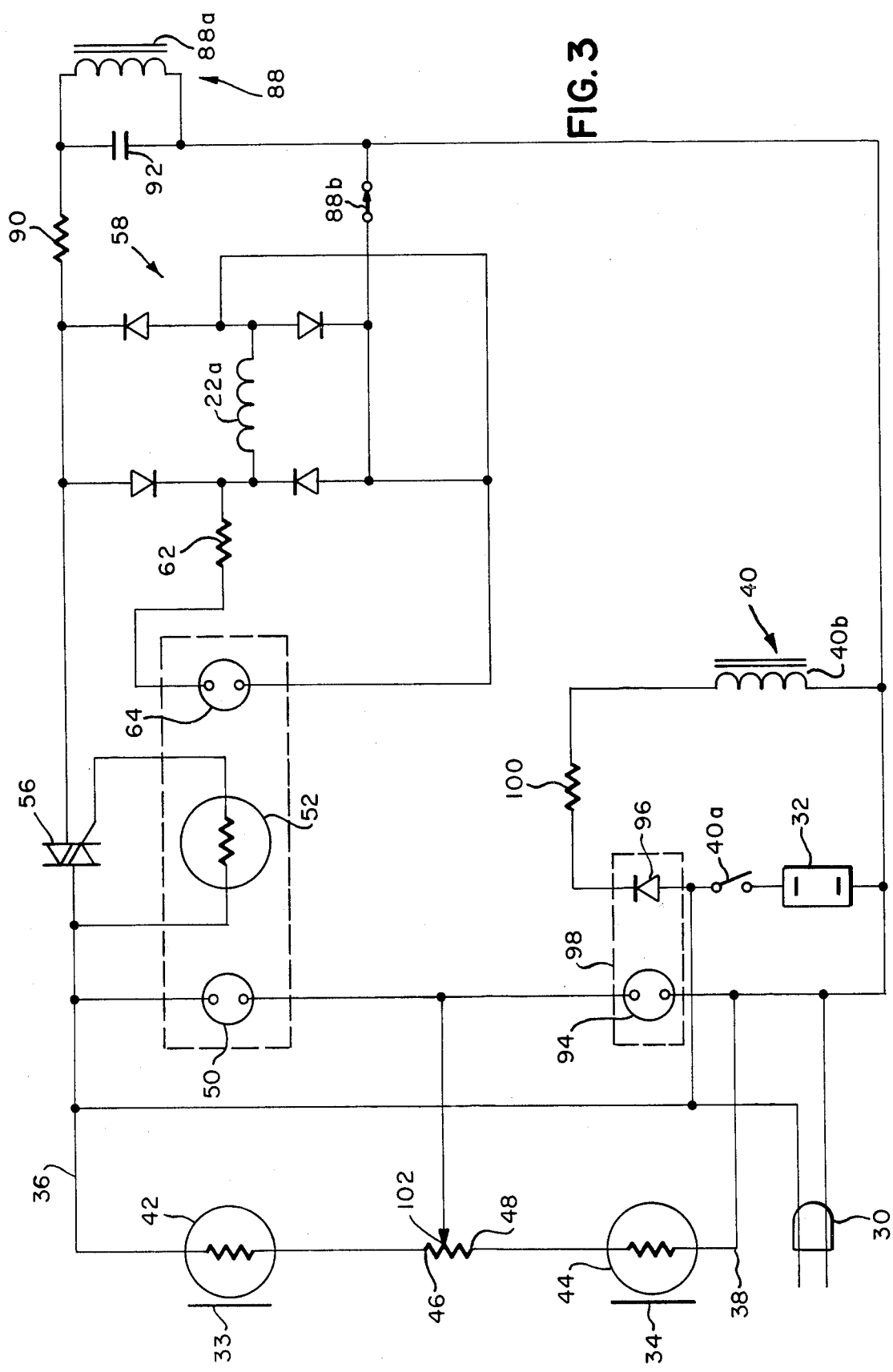
FIG. 3 is a schematic diagram of another circuit that can be used in the control unit.

FIG. 3 is a diagram of a control unit in which the on-off and channel-changing functions are independent of each other. Illumination of the photocell 44 initiates channel change and illumination of the photocell 42 turns the television receiver on or off.

More specifically, when the flashlight beam is aimed at the window 34, the resistance of the photocell 44 decreases and the neon lamp 50 turns on as described above in connection with the circuit of FIG. 2. The solenoid actuator 22 then operates as described above to change the channel to which the televison receiver 14 is turned. An additional relay 88 has been added in FIG. 3 to prevent burnout of the solenoid coil 22a if the flashlight beam is held on the window 34 for a prolonged period of time. The relay 88 functions as follows.

When the solenoid coil 22a has been energized for more than a predetermined length of time, e.g., 1.5 seconds, a time delay circuit comprising a series resistor 90 and parallel capacitor 92 energizes the coil 88a of the relay 88, thereby opening normally closed relay contacts 88b in series with the solenoid coil 22a and deenergizing the latter coil.

With further reference to FIG. 3, the user turns the television receiver on or off by projecting the flashlight beam onto the window 33 so as to reduce the resistance of the photocell 42. This causes the ignition of a neon lamp 94 connected in parallel with the series combination of the photocell 44 and resistor 48. The light from the lamp 94 turns on a light-activated silicon controlled rectifier 96 enclosed in a light-tight housing 98 with the lamp 94. The rectifier 96, in turn, conducts current to the relay coil 40b by way of a series limiting resistor 100. This provides an impulse that opens or closes the contacts 40a in series with the receptacle 32, as described above in FIG. 1.

In FIG. 3, the resistors 46 and 48 are preferably part of a potentiometer whose tap 102 is connected to the junction between the lamps 50 and 94. This permits adjustment of the circuit to balance the sensitivities to light beams directed at the respective photocells 42 and 44.

Figure 4:
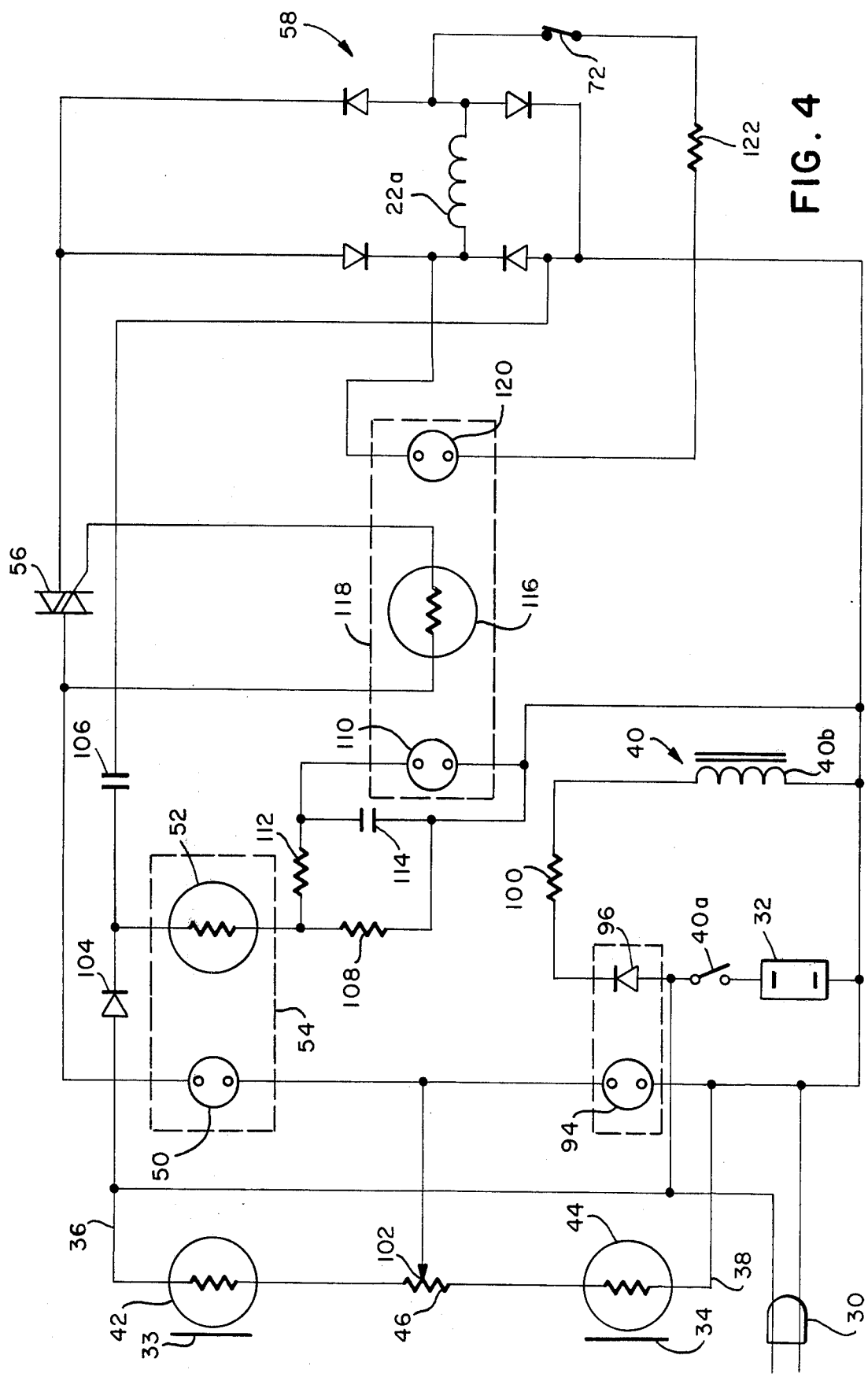
FIG. 4 is a schematic diagram of a still further circuit that can be used.

In FIG. 4, I have illustrated a further embodiment of the invention that facilitates channel changes in multiple increments. In this circuit the photocell 52 is provided with a direct-current input by a rectifier 104 and smoothing capacitor 106. The photocell 52 is connected in series with a resistor 108 to form a voltage divider whose output is applied to a neon lamp 110 by way of a series resistor 112 and a shunt capacitor 114.

When the user desires to change to another channel he aims his flashlight beam at the window 34, and as described above, this causes the lamp 50 to turn on. The resistance of the photocell 52 therefore drops so as to increase the voltage across the resistor 108. After a suitable interval, e.g., 1 second, the capacitor 114 charges to the ignition level of the lamp 110 and the latter lamp flashes to reduce the resistance of a photocell 116 contained in a light-tight enclosure 118 with the lamp 110. The photocell 116 thereupon conducts sufficient gate current for a triac 56 to provide anode-cathode conduction in the triac.

Operation then continues in the manner described in connection with FIG. 1. Thus the gate current in the triac 56 is maintained, until a channel charger has been completed, by means of a neon lamp 120, disposed in the housing 118 and connected in series with a current limiting resistor 122 to the output terminals of the rectifiers 58.

When the lamp 110 ignites it discharges the capacitor 114 and then turns off. If the flashlight beam is maintained on the photocell 44, the capacitor begins to charge again until the lamp 110 ignites once more and thereby triggers another channel change, the lamp 110 and associated circuit elements functioning as a relaxation oscillator. In this manner the user can, by holding the flashlight beam on the photocell 44, effect a series of as many channels as he wishes until the television receiver is turned to the channel he desires. In this connection it should be noted that the period of the relaxation oscillator should be longer than the time required for the channel-changing solenoid actuator 22 (FIG. 1) to complete a single channel-changing cycle.

Because the current applied to the actuator coil 22a is always intermittent in the FIG. 4 circuit, regardless how long the flashlight beam is held as the photocell 44, there is not need for the protection provided by the relay 88 of FIG. 3 or the relay contacts 40c of FIG. 2.

The on-off section of the FIG. 4 circuit is the same as that of FIG. 3.

It will be apparent that further modifications can be made to the various circuits described herein without departing from the scope of the invention. Fore example, the on-off relay 40 can be replaced by a solid-state switching arrangement and the details of the logic circuitry can also be varied. However, the circuitry described above is preferred because it combines low cost with ease of operation and high reliability. The gas discharge lamps have both these characteristics, as noted above, and also so do the photo-conductive cells which respond to the light from these lamps. Moreover, these components operate from the a-c power line without the need for relatively expensive low-voltage, direct-current power supplies.

We claim:

1. An appliance control unit for effecting one or more control operations on an appliance, said control unit comprising
   A. first and second photocell units arranged to be substantially equally responsive to ambient household optical radiation, said photocell units including first and second photoconductive cells, respectively, connected in series to a voltage source,
   B. detection means including
      1. a gaseous discharge first lamp connected across said first photocell so as to be ignited when radiation is preferentially applied to the second photocell, and
      2. a third photoconductive cell arranged to respond to light from said first lamp and thereby provide an initiating signal in response to preferential illumination of said second photocell, and
   C. a control device
      1. for connection to said appliance so as to perform a control operation thereon, and
      2. for performing said control operation in response to said initiating signal.

2. The control unit defined in claim 1 further including
   A. a switch
      1. connected to provide current for said control device and
      2. connected to be turned on by said third photocell in response to light from said first lamp and
   B. a second lamp
      1. connected to be turned on by said switch, and
      2. arranged to illuminate said third photocell.

3. The control unit defined in claim 2 including means operated by said control device for interrupting the current to said second lamp upon completion of said control operation.

4. An appliance control unit for effecting multiple control operations of an appliance, said control unit comprising
   A. first and second photocell units including first and second photocells and so arranged as to be substantially equally responsive to household ambient radiation
   B. detection means for providing a first initiating signal in response to the difference in illumination of said photocell units,
   C. time delay means providing a delayed initiating signal if said initiating signal persists longer than a predetermined interval,
   D. a first control device connected to said appliance so as to perform a first control operation on said appliance in response to said first initiating signal, and
   E. a second control device connected to said appliance so as to perform a second control operation in response to said delayed initiating signal.

5. A control unit as defined in claim 4 in which
   A. said first control device is a channel changer for changing by one increment, in response to said initiating signal, the channel to which a television receiver is tuned and
   B. said second control device is an on-off switch for changing the on-off state of said receiver in response to said delayed initiating signal.

6. The control unit defined in claim 5 in which said channel changer includes
   A. a solenoid-actuated channel changing mechanism including a solenoid coil and effecting a channel change in response to current through said coil,
   B. solid state switching means responsive to said first initiating signal to turn on the current to said coil,
   C. means for maintaining the current through said coil after cessation of said first initiating signal and
   D. means responsive to a predetermined displacement of said channel changing mechanism to turn off said solid state switching means and thereby terminate the current through said coil.

7. The control unit defined in claim 6 including means responsive to said delayed initiating signal for terminating the current through said coil.

8. The control unit defined in claim 6 in which
   A. said detection means includes
      1. a first gas discharge lamp connected across said first photocell so as to be ignited in response to the application of radiant energy preferentially to said second photocell, and
      2. a third photocell
         a. disposed to respond to light from said first lamp, and
         b. connected to turn on said solid state switching means in response to light from said first lamp,
   B. said current maintaining means includes a second lamp
      1. disposed to illuminate said third photocell,
      2. connected to receive current from said solid state switching means and
      3. connected to be turned off by said displacement responsive means

9. An appliance control unit for effecting multiple control operations on an appliance, said control unit comprising
   A. first and second photocells so arranged as to be substantially equally responsive to ambient household radiation
   B. means connecting said photocells in series to a voltage source,
   C. a first gaseous discharge lamp connected to ignition only when the voltage across said first photocell exceeds a threshold level,
   D. a second gaseous discharge lamp connected for ignition only when the voltage across said second photocell exceeds a threshold level,
   E. a first control device for connection to said appliance so as to perform a first control operation on said appliance and
   F. a second control device for connection to said appliance so as to perform a second control operation on said appliance,
   G. first switching means responsive to light from said first lamp to turn on electric current to said first control device, and
   H. second switching means responsive to light from said second lamp to turn on current to said second control device.

* * * * *